(12) United States Patent
Mikata

(10) Patent No.: US 6,383,897 B2
(45) Date of Patent: May 7, 2002

(54) APPARATUS FOR MANUFACTURING A SEMICONDUCTOR DEVICE IN A CVD REACTIVE CHAMBER

(75) Inventor: Yuichi Mikata, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/769,473

(22) Filed: Jan. 26, 2001

Related U.S. Application Data

(62) Division of application No. 08/826,146, filed on Mar. 27, 1997, now Pat. No. 6,211,081.

(30) Foreign Application Priority Data

Apr. 3, 1996 (JP) ............................................. 8-081537

(51) Int. Cl.⁷ .............................................. H01L 21/20
(52) U.S. Cl. ..................... 438/479; 438/680; 438/480; 427/248.1
(58) Field of Search ................................ 438/680, 479, 438/480, 798; 427/248.1, 248.2; 588/900, 244

(56) References Cited

U.S. PATENT DOCUMENTS

| | | | | |
|---|---|---|---|---|
| 4,604,159 A | * | 8/1986 | Kobayashi et al. | 156/617 R |
| 5,425,842 A | * | 6/1995 | Zijlstra | 156/643.1 |
| 5,435,682 A | * | 7/1995 | Crabb et al. | 414/217 |
| 5,728,425 A | * | 3/1998 | Ebe et al. | 427/248.1 |
| 6,194,628 B1 | * | 2/2001 | Pang et al. | 588/900 |
| 6,211,081 B1 | * | 4/2001 | Mikata | 438/680 |
| 6,270,835 B1 | * | 8/2001 | Hunt et al. | 427/79 |
| 6,325,857 B1 | * | 12/2001 | Miyoshi | 118/724 |

FOREIGN PATENT DOCUMENTS

| | | |
|---|---|---|
| EP | 0 214 690 | 9/1986 |
| EP | 0 397 315 | 3/1990 |
| JP | 1-89319 | 9/1987 |
| JP | 6-97075 | 9/1992 |
| JP | 6-252050 | 2/1993 |
| JP | 7-58021 | 8/1993 |
| JP | 8-78339 | 9/1994 |

OTHER PUBLICATIONS

German Official Action and translation for the corresponding German Patent Application of the above–identified application, Aug. 30, 2000, total 10 pages.
J. Vac. Sci. Technol. B. vol. 9(4), Jul./Aug. 1991, pp. 2011–2016.
Appl. Phys. Letters, vol. 48, 1986, pp. 1787–1789.
J. Appl. Phys., vol. 61, 1987, pp. 2407–2409.
J. Crystal Growth, vol. 105, 1990, pp. 359–365.
J. Electrochem. Soc., vol. 136, 1989, pp. 2960–2968.

* cited by examiner

*Primary Examiner*—John F. Niebling
*Assistant Examiner*—Olivia T Luk
(74) *Attorney, Agent, or Firm*—Finnegan, Henderson, Farabow, Garrett & Dunner, L.L.P.

(57) ABSTRACT

In a method of producing a semiconductor apparatus, when a thin film is formed on a semiconductor substrate in the CVD reactive chamber by the CVD method, a remaining region is provided where a gas for film formation remains to a proximity of a surface of the semiconductor substrate, and a CVD thin film is provided on the substrate by decomposing only the gas for film formation existing in the remaining region without supplying an additional gas from the outside of the remaining region to the remaining region. With the method, when the thin film is formed on the substrate by the CVD method, the thin film is efficiently deposited on the substrate in a reactive chamber by efficiently using a reactive gas for film formation introduced into a CVD reactive chamber, to thereby reduce cost of forming the thin film remarkably.

12 Claims, 2 Drawing Sheets

APPARATUS FOR MANUFACTURING A SEMICONDUCTOR DEVICE IN A CVD REACTIVE CHAMBER

This is a divisional of application Ser. No. 08/826,146, filed Mar. 27, 1997, now U.S. Pat. No. 6,211,081 which is incorporated herein by reference.

BACKGROUND OF THE INVENTION

The present invention relates to a method of manufacturing a semiconductor apparatus, a semiconductor production equipment and a cleaning method thereof, more specifically relates to a method of forming a CVD thin film on a surface of a semiconductor substrate, a method of etching a semiconductor substrate, and a method of cleaning a CVD unit and a CVD reactive chamber.

When a thin film is formed by a CVD method on a semiconductor substrate, in a conventional method, a reactive gas (for example, a silane SiH4) as a gas flow 5 for film formation is supplied from outside to an upper portion of a substrate 2 placed on a susceptor 8 provided into a reactive chamber 1 of a CVD unit, shown in FIG. 5.

Gas in supplied via a value 5. A flow rate of the gas is controlled by a mass flow controller 7 so that pressure in the reactive chamber 1 is adjusted to be reduced to about 10 Torr while monitoring a pressure gauge 13. Then, the substrate 2 and the susceptor 8 are heated to 650° C. by an external lamp 3 through a quartz-made wall of the reactive chamber 1, while flowing the gas of 1 slm, so that a polycrystal silicon film is formed.

At this time, a boundary domain, which is called as a remaining region 4 where a gas does not flow, appears on a surface of the substrate 2, and a gas for film formation is supplied from the gas flow 5 outside the remaining region 4. The gas for film formation is diffused in the remaining region 4 and gets to the surface of the substrate. Then, the gas is decomposed so that a polycrystal silicon film is deposited.

A thickness of the remaining region 4 is influenced by the gas flow 5. When the gas flow is not uniform, nonuniformity occurs in thickness of the remaining region 4. As a result, the supply of a gas to the surface of the substrate 2 becomes non-uniform, a depositing speed is varied, and thus the film thickness is varied. Moreover, the supply of the gas from the gas flow 5 is usually determined by pressure division of the gas in the gas flow 5, however under the above condition, only several percentage of the gas in the gas flow 5 is supplied to the remaining region 4, and thus only several percentage of the gas introduced into the reactive chamber 1 is used for the deposition.

Therefore, most of the gas introduced into the reactive chamber 1 is not decomposed, and passes through a main valve 9, a pressure adjusting conductance valve 12 and a pipe arrangement 11 so as to be discharged out of a chamber by a pump 10. As a result, cost of forming a thin film rises.

As mentioned above, in the conventional method of forming a thin film on the semiconductor substrate by deposition, since availability of a reactive gas for film formation introduced into the CVD reactive chamber is low, there arises a problem that cost of forming a thin film rises.

BRIEF SUMMARY OF THE INVENTION

The present invention has been achieved in order to solve the above problem, and it is an object of the present invention to provide a method of producing a semiconductor apparatus and a semiconductor production equipment, which are capable of efficiently depositing a thin film on a semiconductor substrate in a reactive chamber by efficiently using a reactive gas for film formation introduced into a CVD reactive chamber when the thin film is formed by a CVD method on the semiconductor substrate, and is thus capable of reducing the cost of forming a thin film remarkably.

In addition, it is another object of the present invention to provide a method of producing a semiconductor apparatus which is capable of efficiently etching a semiconductor substrate by efficiently using an etching gas introduced into an etching chamber when a surface of the semiconductor substrate is etched in the etching chamber, and is thus capable of reducing the etching cost remarkably.

In addition, it is another object of the present invention to provide a method of cleaning a semiconductor production equipment which is capable of efficiently etching and removing a deposit by efficiently using an etching gas introduced into a semiconductor substrate processing chamber when the deposit on an inner wall surface of the semiconductor substrate processing chamber is etched and removed, and is thus capable of reducing the cleaning cost remarkably.

According to the present invention, there is provided a method of producing a semiconductor apparatus, when a thin film is formed by a CVD method on a semiconductor substrate in a CVD reactive chamber, the method comprising the steps of: providing a remaining region where a gas for film formation remains to a proximity of a surface of the semiconductor substrate; and forming a CVD thin film on the substrate by decomposing only the gas for film formation existing in the remaining region without supplying an additional gas from the outside of the remaining region to the remaining region. The step of providing the remaining region may include the steps of: introducing the semiconductor substrate into the CVD reactive chamber so as to reduce pressure in the CVD reactive chamber to not more than a predetermined value; and introducing a reactive gas into the CVD reactive chamber so as to capture the reactive gas in the CVD reactive chamber by stopping the introduction of the reactive gas when the pressure in the CVD reactive chamber obtains the predetermined value. The step of providing the remaining region may be executed with a temperature of the semiconductor substrate being set so that the CVD thin film may be not formed, and the step of forming the CVD thin film may be executed with the semiconductor substrate being heated to a temperature at which the CVD thin film is formed and without supplying an additional reactive gas from the outside of the CVD reactive chamber. The step of providing the remaining region may include reducing pressure in the CVD reactive chamber to not more than a predetermined value; introducing the semiconductor substrate into the CVD reactive chamber; introducing a reactive gas into the CVD reactive chamber so as to form a closed space to be the remaining region in the proximity of the surface of the semiconductor substrate when the pressure in the CVD reactive chamber obtains a predetermined value; and reducing an introducing flow rate of the reactive gas and at the same time introducing an inert gas into the CVD reactive chamber so as to keep the pressure in the reactive chamber at the predetermined value. The step of forming the closed space may be executed with a temperature of the semiconductor substrate being set so that the CVD thin film is not formed, and the step of forming the CVD thin film may be executed with the semiconductor substrate being heated to a temperature at which the CVD thin film is formed and without supplying an additional reactive gas from the outside of the closed space. When the semiconductor substrate is heated, a rear side of the semiconductor substrate may be heated. When the semiconductor substrate is heated, the semiconductor substrate may be moved from an area where the temperature is lower to an area where the temperature is higher.

According to the present invention, there is also provided a semiconductor production equipment, comprising: a CVD reactive chamber for inducing CVD reaction; a suscepter, for placing a semiconductor substrate, which is provided to the outside of the CVD reactive chamber; a first pipe arrangement, for introducing a reactive gas, which is provided to the outside of the CVD reactive chamber and is connected to the CVD reactive chamber; a first mass flow controller and a first valve provided in a midway of the first pipe arrangement; a second pipe arrangement, for introducing an inert gas, which is provided to the outside of the CVD reactive chamber and is connected to the CVD reactive chamber; a second mass flow controller and a second valve provided to a midway of the second pipe arrangement; a third pipe arrangement, for discharging a gas, which is provided to the outside of the CVD reactive chamber and is connected to the CVD reactive chamber; a pressure gauge and a vacuum exhaust pump which are connected to the third pipe arrangement; a main valve provided between a pressure gauge connecting section and a pump connecting section of the third pipe arrangement; heater means for heating the suscepter and a semiconductor substrate via a wall of the CVD reactive chamber; and a valve controller for when a thin film is formed by a CVD method on the semiconductor substrate, controlling the main valve so that the main valve is closed with pressure in the CVD reactive chamber being reduced to not more than a predetermined value and thereafter when the reactive gas is introduced into the CVD reactive chamber, controlling the first valve so that the first valve is closed with the pressure in the CVD reactive chamber being set to a predetermined value.

According to the present invention, there is yet further provided a semiconductor production equipment, comprising: a CVD reactive chamber for inducing CVD reaction; a suscepter, for placing a semiconductor substrate, which is provided into the CVD reactive chamber; remaining region forming means, for forming a remaining region which is separated from an outside, for leaving a constant volume of a gas for film formation, to a proximity of a surface of the semiconductor substrate; heating means for heating the semiconductor substrate; transporting means for transporting the semiconductor substrate from a substrate stand-by chamber to the CVD reactive chamber; gas supplying means for supplying a gas to the remaining region; and gas exhausting means for exhausting the gas from the remaining region. The gas supplying means may be linked with a substrate stand-by chamber, which is freely divided from the CVD reactive chamber. The heating means may be positioned in the outside of the CVD reactive chamber and may heat the semiconductor substrate placed in the CVD reactive chamber. The heating means may heat a rear side of the semiconductor substrate.

According to the present invention, there is still further provided a semiconductor production equipment, comprising: a CVD reactive chamber for inducing CVD reaction; a suscepter, for placing a semiconductor substrate, which is provided to the outside of the CVD reactive chamber; a first pipe arrangement, for introducing a reactive gas, which is provided to the outside of the CVD reactive chamber and is connected to the CVD reactive chamber; a first mass flow controller and a first valve provided in a midway of the first pipe arrangement; a second pipe arrangement, for introducing an inert gas, which is provided to the outside of the CVD reactive chamber and is connected to the CVD reactive chamber; a second mass flow controller and a second valve provided to a midway of the second pipe arrangement; a third pipe arrangement, for exhausting a gas, which is provided to the outside of the CVD reactive chamber and is connected to the CVD reactive chamber; a pressure gauge and a vacuum exhaust pump which are connected to the third pipe arrangement; a main valve and a conductance valve for adjusting pressure, which are provided between a pressure gauge connecting section and a pump connecting section of the third pipe arrangement; a valve controller for independently controlling the valves; a substrate introducing chamber connected to the CVD reactive chamber via a gate valve; a gate valve controller for controlling opening and closing of the gate valve; a substrate transporter for introducing the semiconductor substrate from the substrate introducing chamber into the CVD reactive chamber; an exhausting device for setting pressure in the substrate introducing chamber to a predetermined value; a cover for surrounding a circumference of the semiconductor substrate in front of the suscepter and forming a constant volume of a closed space to be a remaining region for a gas; a cover driving device which is provided so that the cover is moved in front of the suscepter between a position which surrounds the circumference of the semiconductor substrate and a forward position of the position which surrounds the circumference of the semiconductor substrate; and a heater, for heating the suscepter and the semiconductor substrate, which is provided to a rear side of the suscepter in the CVD reactive chamber. When a thin film is formed by a CVD method on the semiconductor substrate, the gate valve controller may open the gate valve with pressure in the substrate introducing chamber and in the CVD reactive chamber being reduced to not more than predetermined values, and after the semiconductor substrate is introduced from the substrate introducing chamber into the CVD reactive chamber, may close the gate valve, and the cover driving device may be provided so as to move the cover in front of the suscepter between the position which surrounds the circumference of the semiconductor substrate and the forward position of the position which surrounds the circumference of the semiconductor substrate, and when a thin film is formed by a CVD method on the semiconductor substrate, may close the cover with the reactive gas being introduced into the CVD reactive chamber and the pressure in the CVD reactive chamber being set to a predetermined value. After the semiconductor substrate is introduced from the substrate introducing chamber into the CVD reactive chamber, the valve controller may control the valves so that the reactive gas is introduced into the CVD reactive chamber with the gate valve being closed so that the pressure in the CVD reactive chamber is set to a predetermined value, and after the cover is closed, the inert gas may be introduced into the CVD reactive chamber so that the pressure in the CVD reactive chamber is set to a predetermined value.

According to the present invention, there is also provided a method of producing a semiconductor apparatus when forming a thin film by a CVD method on a semiconductor substrate in a CVD reactive chamber by using a semiconductor production equipment comprising: a CVD reactive chamber for inducing CVD reaction; a suscepter, for placing a semiconductor substrate, which is provided to the outside of the CVD reactive chamber; a first pipe arrangement, for introducing a reactive gas, which is provided to the outside of the CVD reactive chamber and is connected to the CVD reactive chamber; a first mass flow controller and a first valve provided in a midway of the first pipe arrangement; a second pipe arrangement, for introducing an inert gas, which is provided to the outside of the CVD reactive chamber and is connected to the CVD reactive chamber; a second mass flow controller and a second valve provided to a midway of the second pipe arrangement; a third pipe arrangement, for exhausting a gas, which is provided to the outside of the CVD reactive chamber and is connected to the CVD reactive chamber; a pressure gauge and a vacuum exhaust pump which are connected to the third pipe arrangement; a main valve and a conductance valve for adjusting pressure, which are provided between a pressure gauge connecting section and a pump connecting section of the third pipe arrangement; a valve controller for independently controlling the valves; a substrate introducing chamber connected to the CVD reactive chamber via a gate valve; a gate valve controller for controlling opening and closing of the gate valve; a substrate transporter for introducing the semiconductor substrate from the substrate introducing chamber into the CVD reactive chamber; an exhausting device for setting pressure in the substrate introducing chamber to a predetermined value; a cover for surrounding a circumference of the semiconductor substrate in front of the suscepter and forming a constant volume of a closed space to be a remaining region for a gas; a cover driving device which is provided so that the cover is moved in front of the suscepter between a position which surrounds the circumference of the semiconductor substrate and a forward position of the position which surrounds the circumference of the semiconductor substrate; and a heater, for heating the suscepter and the semiconductor substrate, which is provided to a rear side of the suscepter in the CVD reactive chamber, the method comprising the steps of: reducing pressure in the CVD reactive chamber to not more than a predetermined value; introducing the semiconductor substrate into the CVD reactive chamber; introducing a reactive gas into the CVD reactive chamber so as to form a closed space to be a remaining region in a proximity of a surface of the semiconductor substrate when the pressure in the CVD reactive chamber obtains the predetermined value; reducing an introducing flow rate of the reactive gas and at the same time introducing an inert gas into the CVD reactive chamber so as to keep the pressure in the reactive chamber at the predetermined value; and forming a CVD thin film on the substrate by decomposing only a gas for film formation existing in the remaining region without supplying an additional gas from the outside of the remaining region to the remaining region. When a thin film is formed by a CVD method on the semiconductor substrate, the gate valve controller may open the gate valve with pressure in the substrate introducing chamber and in the CVD reactive chamber being reduced to not more than predetermined values, and after the semiconductor substrate is introduced from the substrate introducing chamber into the CVD reactive chamber, may close the gate valve, and the cover driving device may be provided so as to move the cover in front of the suscepter between the position which surrounds the circumference of the semiconductor substrate and the forward position of the position which surrounds the circumference of the semiconductor substrate, and when a thin film is formed by a CVD method on the semiconductor substrate, may close the cover with the reactive gas being introduced into the CVD reactive chamber and the pressure in the CVD reactive chamber being set to a predetermined value. After the semiconductor substrate is introduced from the substrate introducing chamber into the CVD reactive chamber, the valve controller may control the valves so that the reactive gas is introduced into the CVD reactive chamber with the gate valve being closed so that the pressure in the CVD reactive chamber is set to a predetermined value, and after the cover is closed, the inert gas may be introduced into the CVD reactive chamber so that the pressure in the CVD reactive chamber is set to a predetermined value. The step of forming the closed space may be executed with a temperature of the semiconductor substrate being set so that a CVD thin film is not formed, and the step of forming the CVD thin film may be executed with the semiconductor substrate being heated to a temperature at which the CVD thin film is formed and without supplying an additional reactive gas from an outside of the closed space.

According to the present invention, there is further provided a semiconductor production equipment, comprising: a CVD reactive chamber for inducing CVD reaction; a substrate stand-by chamber which is linked with the CVD reactive chamber; a shutter which freely opens and closes a position which divides the CVD reactive chamber and the substrate stand-by chamber; a shaft which goes through a bottom plate of the substrate stand-by chamber and freely moves up and down; a shaft driving device for driving the shaft in an up-down direction; a cylindrical cover which is provided to a top of a chamber of the shaft, has an opening in a front towards the CVD reactive chamber, surrounds a circumference of the semiconductor substrate with the opening being closed by the semiconductor substrate, and forms a constant volume of a closed space to be a gas remaining region; a first pipe arrangement, for introducing a reactive gas, which is provided to the outside of the substrate stand-by chamber and is connected to the CVD reactive chamber; a first mass flow controller and a first valve which are provided in a midway of the first pipe arrangement; a second pipe arrangement, for introducing an inert gas, which is provided to the outside of the CVD reactive chamber and is connected to the CVD reactive chamber; a second mass flow controller and a second valve which are provided to a midway of the second pipe arrangement; a third pipe arrangement, for exhausting a gas, which is provided to the outside of the CVD reactive chamber and is connected to the CVD reactive chamber; a pressure gauge and a vacuum exhaust pump which are connected to the third pipe arrangement; a first main valve and a first conductance valve for adjusting pressure which are provided between a pressure gauge connecting section and a pump connecting section of the third pipe arrangement; a fourth pipe arrangement, for discharging a gas, which is provided to the outside of the substrate stand-by chamber and is connected to the substrate stand-by chamber; a pressure gauge and a vacuum exhaust pump which are connected to the fourth pipe arrangement; a second main valve and a second conductance valve for adjusting pressure which are provided between a pressure gauge connecting section and a pump connecting section of the fourth pipe arrangement; a valve controller for independently controlling the valves; a substrate introducing chamber which is connected to the substrate stand-by chamber via a gate valve; an exhausting device for reducing pressure in the substrate introducing chamber to a predetermined value; a gate valve controller for opening and closing the gate valve; a substrate transporting unit which has a function for introducing the semiconductor substrate from the substrate introducing chamber into the substrate stand-by chamber, a function for retaining the semiconductor substrate in the substrate stand-by chamber in a position separated from the cover, and a function for placing a surface to be processed of the semiconductor substrate towards the shaft side so as to close the opening of the cylindrical cover; and a heater for heating the semiconductor substrate through a top plate of the CVD reactive chamber.

According to the present invention, there is still further provided a method of producing a semiconductor apparatus, when a thin film is formed by a CVD method on a semiconductor substrate in the CVD reactive chamber by using the semiconductor production equipment, comprising: a CVD reactive chamber for inducing CVD reaction; a substrate stand-by chamber which is linked with the CVD reactive chamber; a shutter which freely opens and closes a position which divides the CVD reactive chamber and the substrate stand-by chamber; a shaft which goes through a bottom plate of the substrate stand-by chamber and freely moves up and down; a shaft driving device for driving the shaft in an up-down direction; a cylindrical cover which is provided to a top of a chamber of the shaft, has an opening in a front towards the CVD reactive chamber, surrounds a circumference of the semiconductor substrate with the opening being closed by the semiconductor substrate, and forms a constant volume of a closed space to be a gas remaining region; a first pipe arrangement, for introducing a reactive gas, which is provided to the outside of the substrate stand-by chamber and is connected to the CVD reactive chamber; a first mass flow controller and a first valve which are provided in a midway of the first pipe arrangement; a second pipe arrangement, for introducing an inert gas, which is provided to the outside of the CVD reactive chamber and is connected to the CVD reactive chamber; a second mass flow controller and a second valve which are provided to a midway of the second pipe arrangement; a third pipe arrangement, for exhausting a gas, which is provided to the outside of the CVD reactive chamber and is connected to the CVD reactive chamber; a pressure gauge and a vacuum exhaust pump which are connected to the third pipe arrangement; a first main valve and a first conductance valve for adjusting pressure which are provided between a pressure gauge connecting section and a pump connecting section of the third pipe arrangement; a fourth pipe arrangement, for discharging a gas, which is provided to the outside of the substrate stand-by chamber and is connected to the substrate stand-by chamber; a pressure gauge and a vacuum exhaust pump which are connected to the fourth pipe arrangement; a second main valve and a second conductance valve for adjusting pressure which are provided between a pressure gauge connecting section and a pump connecting section of the fourth pipe arrangement; a valve controller for independently controlling the valves; a substrate introducing chamber which is connected to the substrate stand-by chamber via a gate valve; an exhausting device for reducing pressure in the substrate introducing chamber to a predetermined value; a gate valve controller for opening and closing the gate valve; a substrate transporting unit which has a function for introducing the semiconductor substrate from the substrate introducing chamber into the substrate stand-by chamber, a function for retaining the semiconductor substrate in the substrate stand-by chamber in a position separated from the cover, and a function for placing a surface to be processed of the semiconductor substrate towards the shaft side so as to close the opening of the cylindrical cover; and a heater for heating the semiconductor substrate through a top plate of the CVD reactive chamber, the method comprising the steps of: reducing pressure in the substrate introducing chamber to not more than a predetermined value with the shutter; reducing pressure in the substrate stand-by chamber to not more than a predetermined value with the shutter being closed and the cover being located in the substrate stand-by chamber; opening the gate valve so as to introduce the semiconductor substrate from the substrate introducing chamber into the substrate stand-by chamber and to retain the semiconductor substrate in the substrate stand-by chamber in a position separated from the cover, and closing the gate valve; after introducing a reactive gas into aid substrate stand-by chamber with the shutter being closed, and placing the surface to be processed of the semiconductor substrate towards the shaft side so that the opening of the cover is closed when the pressure in the substrate stand-by chamber obtains the predetermined value, and forming a closed space to be the remaining region in a proximity of the surface of the semiconductor substrate, reducing an introducing flow rate of the reactive gas; introducing an inert gas into the CVD reactive chamber so as to keep the pressure in the CVD reactive chamber at the predetermined value; heating a top plate of the CVD reactive chamber so as to set a temperature of the CVD reactive chamber to a predetermined value; opening the shutter so as to introduce the cover and the semiconductor substrate into the CVD reactive chamber by moving them by the shaft, and heating a rear side of the semiconductor substrate by heat radiation from the top plate so as to set a temperature of the semiconductor substrate to a predetermined value; and stopping the heating after a constant time passes so as to introduce the cover and the semiconductor substrate into the substrate stand-by chamber by moving them by the shaft, and closing the shutter.

According to the present invention, there is yet further provided a method of producing a semiconductor apparatus, wherein when a surface of a semiconductor substrate is etched in an etching chamber, a remaining region where an etching gas remains in a proximity of the surface of the substrate, is provided, and the surface of the semiconductor substrate is etched only by the etching gas existing in the remaining region without supplying an additional etching gas from the outside of the remaining region to the remaining region.

According to the present invention, there is also provided a method of cleaning a semiconductor production equipment, wherein when a deposit which is deposited on an inner wall surface of a semiconductor substrate processing chamber is removed by etching, after an etching gas for removing a deposit is introduced into the processing chamber, the etching gas remains in the processing chamber, and the deposit is removed by etching without supplying an additional etching gas from the outside.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The following describes embodiments of the present invention in detail on reference to drawings.

Figure 1:
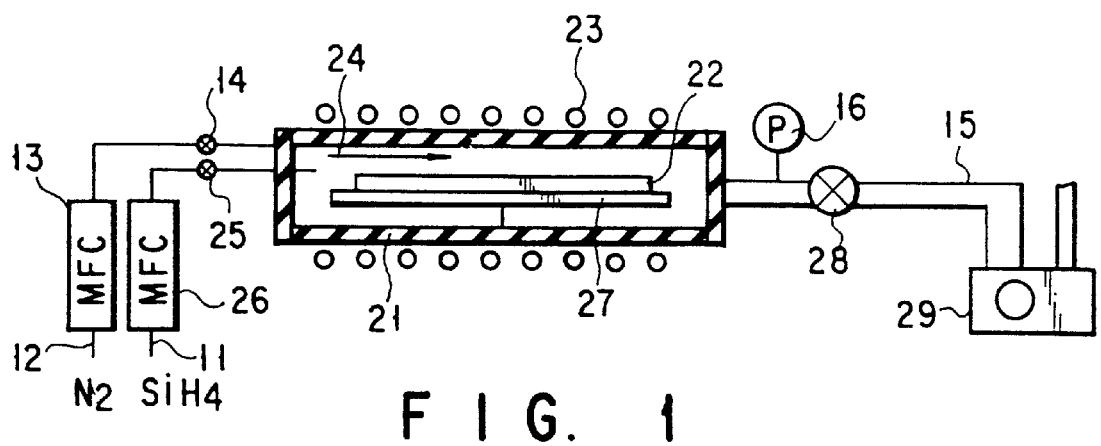
FIG. 1 is a cross sectional view which shows a schematic arrangement of an example of a CVD unit used in a method of forming a CVD thin film according to a first embodiment of a method of producing a semiconductor apparatus of the present invention.

FIG. 1 shows an example of a CVD unit which is used for a method of forming a CVD thin film according to a first embodiment in a method of producing a semiconductor apparatus of the present invention.

Figure 5:
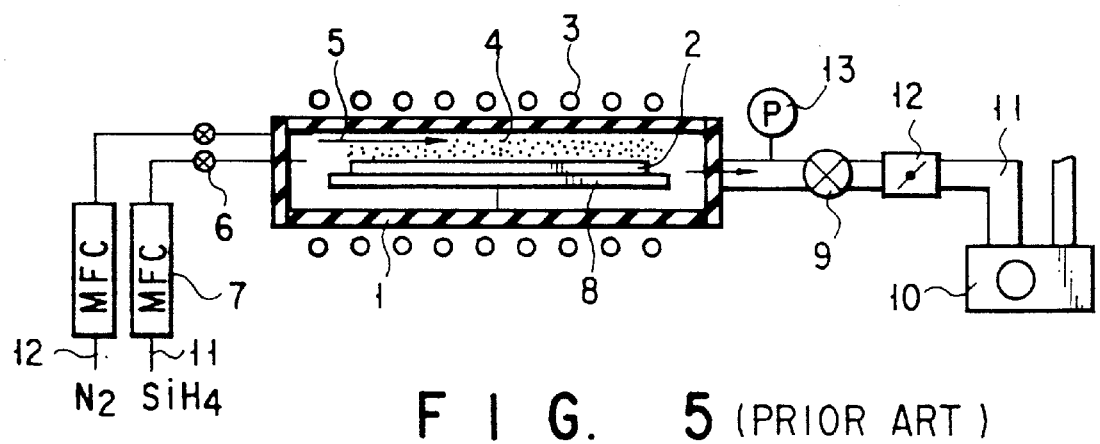
FIG. 5 is a cross sectional view which shows a schematic arrangement of a conventional CVD unit.

The CVD unit shown in FIG. 1 is different from the conventional CVD unit shown in FIG. 5 in that a pressure adjusting conductance valve is not provided, however the other parts are substantially the same.

Specifically, in FIG. 1, 21 is a quartz-made reactive chamber, 27 is a susepter made of, for example, SiC, provided in the reactive chamber, and 22 is a semiconductor substrate placed on the susepter 27.

The outside of the reactive chamber 21 is provided with a first pipe arrangement 11 for introducing a reactive gas (material gas, such as a $SiH_4$ gas), a first mass flow controller 26 and a first valve 25, for controlling a flow rate of the reactive gas, which are provided in a midway of the first pipe arrangement, a second pipe arrangement 12 for introducing an inert gas (for example $N_2$), a second mass flow controller 13 and a second valve 14, for controlling a flow rate of the inert gas, which are provided to a midway of the second pipe arrangement, a third pipe arrangement 15 for discharging a gas, a pressure gauge 16 and a vacuum exhausting pump 29 which are connected to the third pipe arrangement, a main valve 28 provided to a midway of the third pipe arrangement (between the pressure gauge connecting section and the pump connecting section), a lamp 23 for heating the susepter 27 and the substrate 22 through the wall of the reactive chamber, etc.

The following describes a method of forming a CVD thin film using the CVD unit shown in FIG. 1.

First, after the substrate 22 is introduced into the reactive chamber 21 at a temperature of not more than 300° C., pressure is reduced to not more than $10^{-2}$ Torr (1 Torr= 133.322 Pa) by the pump 29. Thereafter, the main valve 28 is closed, and a $SiH_4$ gas 24 is introduced from a reactive gas source into the reactive chamber 21 through the first mass flow controller 26 and the first valve 25. Then, the pressure in the reactive chamber is checked by the pressure gauge 16 to becomes 10 Torr, and the introduction of the reactive gas is stopped by closing the first valve 25.

In such a manner, with the $SiH_4$ gas being sealed in the reactive chamber at the pressure of 10 Torr, the substrate 22 and the susepter 27 are heated by the lamp 23 with heat up rate of 20° C./sec, and after a temperature of the substrate 22 is set to 800° C. and kept for one minutes, the heating is stopped. As a result, the $SiH_4$ is decomposed on the substrate 22, and thus a polycrystal silicon with a thickness of 400 nm is deposited on the substrate 22 and the susepter 27.

Thereafter, when the temperature is lowered to not more than 600° C., the main valve 28 is opened so that the gas is discharged out of the reactive chamber.

In the aforementioned method of forming the CVD thin film, since the reactive gas 24 hardly flows in the reactive chamber 21, a remaining region is produced on the substrate 22. Therefore, nonuniformity of the reactive gas flow does not occur, and scattering of the supplying of the reactive gas to the substrate does not occur. By the way, such a satisfactory result, that the uniformity of a thickness of the formed CVD thin film in the substrate was less than ±2%, was obtained.

In addition, since the gas is not exhausted from the chamber during the film formation, the availability of the using gas can be improved. Such a satisfactory result, that the availability of the reactive gas was not less than 50%, was obtained.

Here, during the film formation, a temperature of the inner wall of the reactive chamber 21 becomes not more than 400° C. due to air cooling, and depositing of polycrystal silicon hardly occurs on the inner surface of the reactive chamber 21. However, since the polycrystal silicon is deposited on the susepter 27, etc. due to long-time use, it is necessary to execute cleaning.

Therefore, after the polycrystal silicon of 30 μm, for example, is deposited on the susepter 27, the deposit is removed by an etching gas such as HCl and $ClF_3$ (execute gas cleaning).

In this case, the etching may be execute while letting HCl flow in the reactive chamber 21, but according to the aforementioned formation of the CVD thin film, the etching is executed under high pressure of about 100 Torr with the etching gas remaining in the reactive chamber 21 so that the availability of the etching gas can be improved to not less than 50%. Here, the polycrystal silicon which adhered to the quartz-made inner wall of the reactive chamber 21 can be removed by acid-cleaning.

In addition, in the above embodiment, the CVD thin film is deposited under the conditions of 10 Torr and 800° C., but the pressure may be in the range of 1 mTorr–200 Torr, and the temperature may be in the range of 500° C.–900° C.

In addition, the method of forming a CVD thin film of the present invention is not limited to the polycrystal silicon, so it is applicable to the case where a silicon oxide film, a silicon nitride, thin films made of W, WSi, TiN, etc. are deposited.

Figure 2:
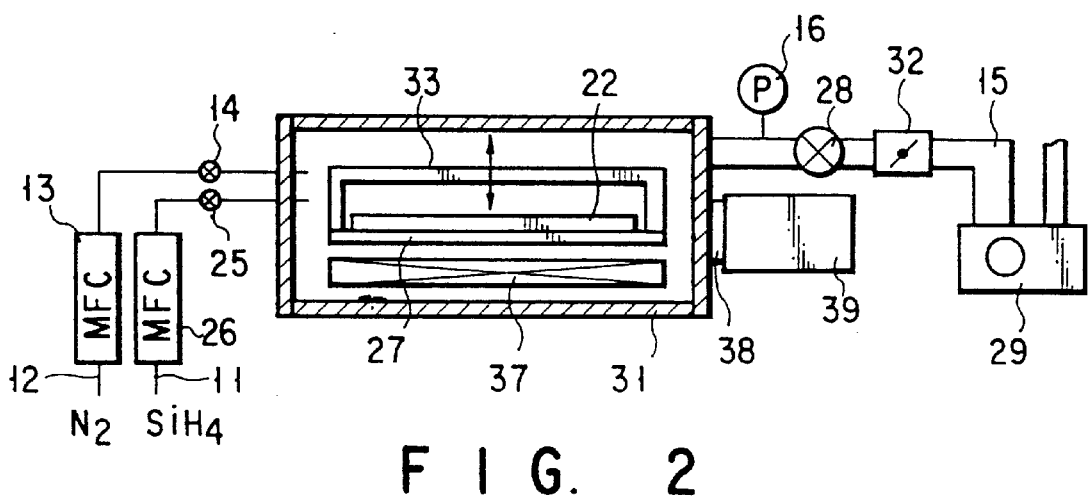
FIG. 2 is a cross sectional view which shows a schematic arrangement of an example of the CVD unit used in the method of forming a CVD thin film according to a second embodiment of the present invention.

FIG. 2 shows an example of the CVD unit which is used for a method of forming a CVD thin film according to a second embodiment of the present invention.

The CVD unit shown in FIG. 2 is different from the CVD unit shown in FIG. 1 in that (1) a pressure adjusting conductance valve 32 is placed between the main valve 28 and the pump connecting section in the midway of the third pipe arrangement, (2) a substrate introducing chamber 39 for introducing the substrate 22 into a reactive chamber 31 is connected to the reactive chamber 31 via a gate valve 38, and the substrate introducing chamber 39 can be set so as to have reduced pressure by an exhausting pump (not shown) before the introduction of the substrate 22, (3) a cover, which has a such a shape that surrounds a circumference of the substrate on the susepter 27, is provided, and the cover 33 can be moved up and down between the position which surrounds the circumference of the substrate on the susepter 27 and its upward position by a driving unit (not shown), and (4) a resistance-heating-type heater 37 is provided below the susepter 27 in the reactive chamber 31 so as to heat the suscepter 27 and the rear side of the substrate, and the aforementioned lamp outside the reactive chamber is not provided. The other parts are substantially the same.

Namely, in FIG. 2, 31 is a metal-made reactive chamber, 27 is a suscepter, 22 is a substrate, 11 is a first pipe arrangement for introducing a reactive gas, 26 is a mass flow controller for controlling a flow rate of a reactive gas, 25 is a valve of the first pipe arrangement, 12 is a second pipe arrangement for introducing an inert gas, 13 is a mass flow controller for controlling a flow rate of an inert gas, 14 is a valve of the second pipe arrangement, 15 is a third pipe arrangement for discharging a gas, 16 is a pressure gauge, 28 is a main valve, 29 is a pump for vacuum exhaust, and 32 is a pressure adjusting conductance valve.

The following explains a method of forming a CVD thin film using the CVD unit shown in FIG. 2.

First, the pressure of the substrate introducing chamber 39 is reduced to not more than $10^{-2}$ Torr, and in the same manner as the substrate introducing chamber 39, the pressure of the reactive chamber 31 is reduced to not more than $10^{-2}$ Torr and its temperature is set to not more than 300° C.

Next, the gate valve 38 is opened, and the substrate 22 is introduced from the substrate introducing chamber 39 into the reactive chamber 31 with the same pressure as the substrate introducing chamber 39. Then, the substrate 22 is placed on the susceptor 27 with the cover 33 being opened, and the gate valve 38 is closed.

Next, a $SiH_4$ gas is passed from a reactive gas source through the mass flow controller 26 and the valve 25 so as to be introduced into the reactive chamber 31. Then, the pressure in the reactive chamber 31 is adjusted so as to be 10 Torr by the conductance valve 32 while checking the pressure through the pressure gauge 16.

When the cover 33 is closed, a closed space (a reactive gas remaining region), which surrounds the circumference of the substrate, is formed by the susceptor 27 and the cover 33. Thereafter, the flow rate of the reactive gas in the mass flow controller 26 is reduced, and at the same time $N_2$ gas is introduced from an inert gas source through the mass flow controller 13 and the valve 14 into the reactive chamber 31 so that the pressure in the reactive chamber 31 is kept at 10 Torr.

In such a manner, with the $SiH_4$ gas being captured at 10 Torr in the closed space which surrounds the circumference of the substrate, the susceptor 27 is heated by the heater 37, the temperature of the substrate 22 in the closed space is raised to 800° C. with heat up rate of 10° C./sec. As a result, the $SiH_4$ in the closed space is decomposed on the substrate 22, and polycrystal silicon is deposited on the substrate. Then, when the heating by the heater 37 is stopped after one minutes, the temperature of the substrate is lowered, and after the cover 33 is opened and a residual gas in the reactive chamber 31 is exhausted, the substrate 22 is taken out from the reactive chamber 31.

In such a method, similarly to the first embodiment, the polycrystal silicon could be deposited on the substrate. At his time, the temperature in the substrate 22 could be set constant by heating the susceptor by the heater 37. Moreover, since the $SiH_4$ gas does not remain except in the closed space by an purge effect of the $N_2$ gas, the polycrystal silicon is not deposited on the inner wall of the reactive chamber 31.

As to the polycrystal silicon deposited in the cover 33 by the long-period film formation, the etching gas is captured in the closed space in the same manner as the deposition so that the polycrystal silicon is removed by etching at a temperature of 900° C. As a result, the availability of the HCI gas can be improved to not less than 50%. At this time, while letting the HCI gas of about 5 slm flow in the reactive chamber 31, the polycrystal silicon may be removed by etching. Moreover, the condition of the deposition may be changed in the same manner as the first embodiment. Moreover, as to the arrangement of the CVD unit, while the relative position of the cover 33, the susceptor 27, the substrate 22 and the heater 37 is being retained, their up-down relation may be inverted or their direction may be changed arbitrarily.

Figure 3:
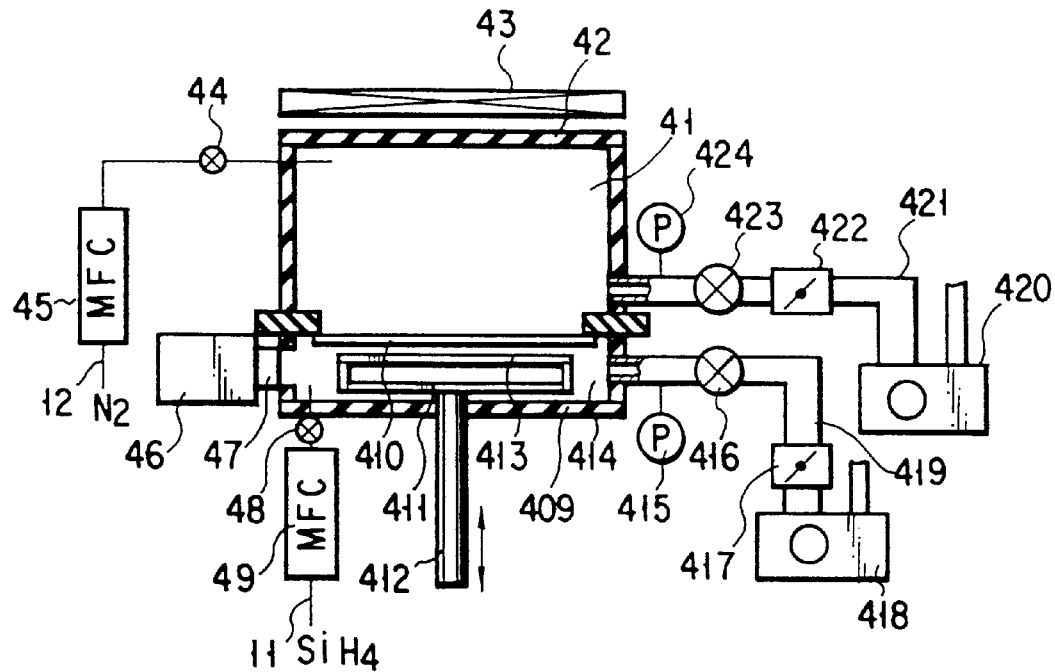
FIGS. 3 and 4 are cross sectional views which show different operating states of a schematic arrangement of an example of the CVD unit used in the method of forming a CVD unit according to a third embodiment of the present invention.
Figure 4:
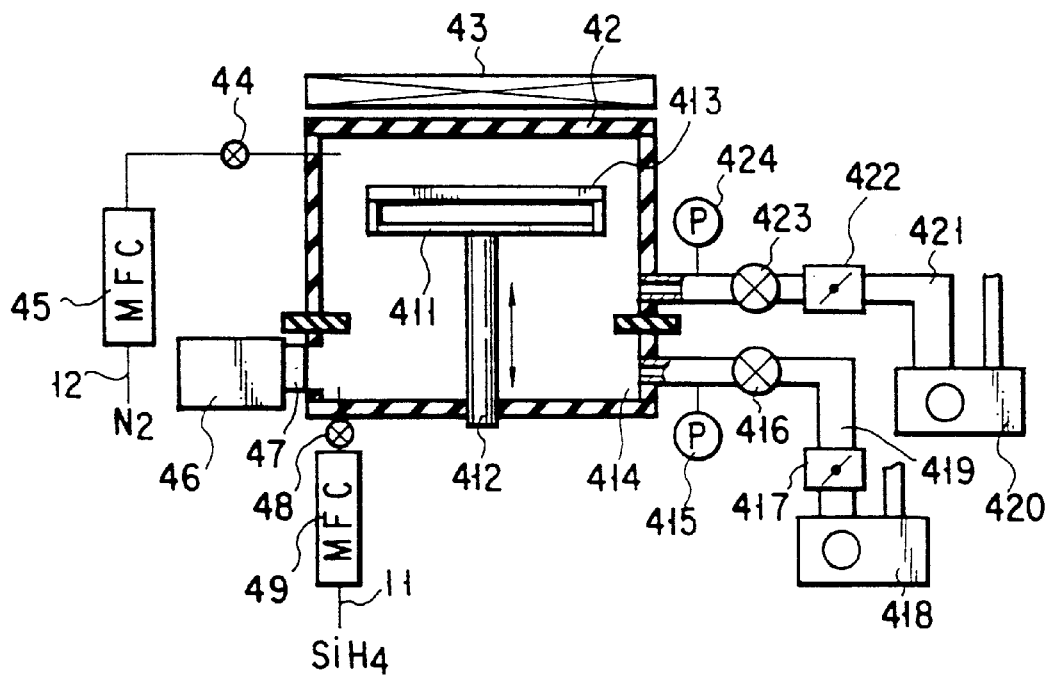

FIGS. 3 and 4 show different operating states for an example of the CVD unit used in the method of forming a CVD thin film according to a third embodiment of the present invention.

The CVD unit shown in FIGS. 3 and 4 is different from the CVD unit shown in FIG. 2 in that (1) a SiC-made reactive chamber 41 and a substrate stand-by chamber 414 are separated by the water-cooled shutter 410 and are connected to each other, (2) the first pipe arrangement 11 for introducing a reactive gas is connected to a substrate stand-by chamber 414, and the second pipe arrangement 12 for introducing an inert gas is connected to the reactive chamber 41, (3) similarly to the reactive chamber 41, a fourth pipe arrangement 419 for discharging a gas is connected to the substrate stand-by chamber 414, a pressure gauge 415 and a vacuum exhausting pump 418 are connected to the fourth pipe arrangement, and a main valve 416 and a pressure adjusting conductance valve 417 are provided to a midway of the fourth pipe arrangement 419 (between a pressure gauge connecting section and a pump connecting section), (4) a shaft 412 is provided so as to go through a bottom plate of the substrate stand-by chamber 414 and to freely move up and down, a cylindrical cover 411 with an opened top where a substrate 413 is placed downward is provided to the top of the shaft 412, and a shaft driving unit (not shown) for driving the shaft 412 up and down is provided outside the substrate stand-by chamber, (5) a substrate transporting/retaining unit (not shown), which has a function for introducing the substrate 413 from the substrate introducing chamber 46 into the substrate stand-by chamber 414, a function for retaining the substrate 413 in a position separated from the cover 411 in the substrate stand-by chamber 414 and a function for placing the surface to be processed of the substrate 413 towards the shaft 412 so that the opening of the cover 411 is closed, is provided, and (6) a heater 43 for heating the rear side of the substrate 413 through a SiC-made top plate 42 of the reactive chamber 41 is provided outside the reactive chamber, and the aforementioned heater 37 in the reactive chamber is not provided.

Namely, the CVD unit shown in FIGS. 3 and 4 includes the CVD reactive chamber 41 for inducing CVD reaction, the substrate stand-by chamber 414 linked with the CVD reactive chamber, the shutter 410 which freely opens and closes the position separating the CVD reactive chamber from the substrate stand-by chamber, the shaft 412 which goes through the bottom plate of the substrate stand-by chamber and freely moves up and down, the shaft driving unit (not shown) for driving the shaft in the up-down direction, the cylindrical cover 411 which is provided to the top of the chamber of the shaft, has the opening at the front towards the CVD reactive chamber, surrounds the circumference of the substrate with the opening being closed by the substrate 413, and forms a constant volume of closed space to be a gas remaining region, the first pipe arrangement 11, for introducing a reactive gas, which is provided outside the substrate stand-by chamber and is connected to the CVD reactive chamber, the first mass flow controller 49 and the first valve 48 which are provided to the midway of the first pipe arrangement, the second pipe arrangement 12, for introducing an inert gas, which is provided outside the CVD reactive chamber and is connected to the CVD reactive chamber, the second mass flow controller 45 and the second valve 44 which are provided to the midway of the second pipe arrangement, the third pipe arrangement 421, for exhausting a gas, which is provided outside the CVD reactive chamber and is connected to the CVD reactive chamber, a pressure gauge 424 and a vacuum exhausting pump 420 which are connected to the third pipe arrangement, a first main valve 423 and a first conductance valve 422 for adjusting pressure which are provided between a pressure gauge connecting section and a pump connecting section of the third pipe arrangement 421, the fourth pipe arrangement 419, for discharging gas, which is provided outside the substrate stand-by chamber 414 and is connected to the substrate stand-by chamber, the pressure gauge 415 and the vacuum exhausting pump 418 which are connected to the fourth pipe arrangement, the second main valve 416 and the second conductance valve 417 for adjusting pressure which are provided between a pressure connecting section and a pump connecting section of the fourth pipe arrangement, a valve controller (not shown) for independently controlling the valves, the substrate introducing chamber 46 which is connected to the substrate stand-by chamber via the gate valve 47, an exhausting unit (not shown) for setting the substrate introducing chamber so as to have a reduced pressure, a gate valve controller (not shown) for controlling opening and closing of the gate valve 47, a substrate transporting unit (not shown) which has a function for introducing the substrate from the substrate introducing chamber into the substrate stand-by chamber, a function for retaining the substrate in a position separated from the cover in the substrate stand-by chamber, and a function for placing the surface to be processed of the substrate towards the shaft so that the opening of the cover is closed, and a heater 43, for heating the substrate through the top plate 42 of the CVD reactive chamber, which is provided outside the CVD reactive chamber.

When the CVD thin film is formed by the CVD method on the substrate in the CVD reactive chamber by using the CVD unit shown in FIGS. 3 and 4, the following steps are followed.

Namely, the following steps are followed: the step of reducing pressure in the substrate introducing chamber 414 to a predetermined value with the shutter 410 being closed; the step of reducing pressure in the substrate stand-by chamber with the shutter 410 is being closed and the cover 411 being positioned in the substrate stand-by chamber; the step of opening the gate valve 47 so that the substrate 413 is introduced from the substrate introducing chamber 46 into the substrate stand-by chamber and that the substrate is retained in a position separated from the cover 411 in the substrate stand-by chamber, and closing the gate valve 47; the step of introducing a reactive gas into the substrate stand-by chamber with the shutter 410 being closed, placing the surface to be processed of the substrate towards the shaft 412 so that the opening of the cover is closed when the pressure in the chamber comes to the set pressure, and after the closed space to be a gas remaining region is formed in the proximity of the surface of the substrate, reducing a flow rate of the reactive gas; the step of introducing an inert gas into the CVD reactive chamber 41 so as to retain the pressure in the CVD reactive chamber at a predetermined value; the step of heating the top plate 42 of the CVD reactive chamber so as to set the temperature of the CVD reactive chamber to a predetermined value; the step of opening the shutter 410 so as to introduce the cover 411 and the substrate 413 into the CVD reactive chamber by moving them by the shaft 412, and heating the rear side of the substrate by heat radiation from the top plate 42 so as to set the temperature of the substrate to a predetermined value; and step of stopping the heating after a constant time passed, introducing the cover 411 and the substrate 410 into the substrate stand-by chamber 414 by moving them by the shaft 412, and closing the shutter 413.

The following concretely describes the above steps.

First, with the substrate being set in the substrate introducing chamber 414, and as shown in FIG. 3, the gate valve 47 being closed, the pressure in the substrate introducing chamber 46 is reduced to not more than $10^{-2}$ Torr. Moreover, with the cover 411 being positioned in the substrate stand-by chamber 414, the pressure of the substrate stand-by chamber 414 is reduced to not more than $10^{-2}$ Torr in the same manner as the substrate introducing chamber 46.

Next, the gate valve 47 is opened, and the substrate 413 is introduced from the substrate introducing chamber 46 into the substrate stand-by chamber 414 with the same pressure as the chamber 46. Then, the substrate is retained above the cover 411 with the substrate facing downward, and the gate valve 47 is closed.

Next, in the same manner as the second embodiment, a $SiH_4$ gas is allowed to pass from the reactive gas source through the mass flow controller 49 and the valve 48 so as to introduced into the substrate stand-by chamber 414. Then, the pressure in the reactive chamber is adjusted to 10 Torr by the conductance valve 417 while checking the pressure through the pressure gauge 415. The substrate is placed on the cover 411 with it facing downward so that the closed space which surrounds the circumference of the substrate is formed.

Next, in order to reduce the flow rate of the reactive gas into the mass flow controller 49 and to purge the reactive chamber 41 other than the closed space by a $N_2$ gas, the $N_2$ gas of 1 slm is allowed to pass from the inert gas source through the mass flow controller 45 and the valve 44 so as to be introduced into the reactive chamber 41, and the pressure in the reactive chamber 41 is maintained at 10 Torr in the same manner as the substrate stand-by chamber. Moreover, the top plate 42 of the reactive chamber 41 is heated by the heater 43 so that the temperature of the top side of the reactive chamber 41 to 1150° C.

Next, as shown in FIG. 4, the shutter 410 is opened, and with the $SiH_4$ gas being captured in the closed space which surrounds the circumference of the substrate at 10 Torr, as mentioned above, the cover 411 and the substrate 413 are raised. At this time, the substrate 413 is brought close to the top plate 42 of the reactive chamber, and when the rear side of the substrate 413 receives the heat radiation from the top plate 42, the temperature of the substrate 413 rises. Distance between the top plate 42 and the substrate 413 is adjusted so that the temperature of the substrate 413 becomes 800° C. with heat up rate of 20° C./sec, and the temperature is maintained at 800° C. for one minutes.

As a result, the $SiH_4$ gas in the closed space is decomposed on the substrate 413, and polycrystal silicon is decomposed on the substrate. Then, in order to stop the heating by the heater 43 after one minutes, the cover 411 and the substrate 413 are lowered so as to be moved to the substrate stand-by chamber 414. Then, the shutter 410 is closed.

Next, the substrate 413 is raised by a mechanism, not shown, and a gas remaining in the substrate stand-by chamber 414 is exhausted by the pump 418. Thereafter, the substrate 413 is taken out of the CVD unit.

Similarly to the first and second embodiments, the polycrystal silicon could be deposited on the substrate uniformly by the above method. Moreover, since the $SiH_4$ gas does not remain in the reactive chamber 41 other than the closed space by the purge effect of the $N_2$ gas, polycrystal silicon is not decomposed on the inner wall of the reactive chamber 41. Moreover, the availability of gas was improved more than the first and second embodiments.

Here, the polycrystal silicon deposited on the cover 411 by the long-period film formation was removed by etching with a dummy substrate being used, an etching being captured in the closed space in the same manner as the deposition, and the temperature of the reactive chamber 41 being raised to 900° C. in the same manner as the deposition.

At this time, only the cover 411 is introduced into the reactive chamber 41, and while letting HCl of 5 slm flow in the reactive chamber 41, the polycrystal silicon may be removed by etching at 900° C. and at 10 Torr. Moreover, The $SiH_4$ may be supplied to the closed space through an inner section of the shaft.

As mentioned above, in accordance with the present invention, it is possible to provide the method of producing a semiconductor apparatus and the semiconductor production equipment, which is capable of, when a thin film is formed on the substrate by the CVD method, depositing the thin film on the substrate in the reactive chamber efficiently and uniformly by efficiently using a reactive gas for film formation introduced into the CVD reactive chamber, and reducing the cost of forming the thin film remarkably.

In addition, in accordance with the method of forming a semiconductor apparatus according to the present invention, when etching the surface of the substrate in the etching chamber, the substrate can be etched efficiently by efficiently using an etching gas introduced into the chamber, and the cost of etching can be reduced remarkably.

In addition, in accordance with the method of cleaning a semiconductor production equipment according to the present invention, when removing a deposition which is deposited on the inner wall of the substrate processing chamber by etching, the deposition can be removed by etching efficiently by efficiently using an etching gas introduced into the processing chamber, and the cost of cleaning can be reduced remarkably.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor production equipment, comprising:
   a CVD reactive chamber for inducing CVD reaction;
   a susceptor, for placing a semiconductor substrate, which is provided to the outside of said CVD reactive chamber;
   a first pipe arrangement, for introducing a reactive gas, which is provided to the outside of said CVD reactive chamber and is connected to said CVD reactive chamber;
   a first mass flow controller and a first valve provided in a midway of said first pipe arrangement;
   a second pipe arrangement, for introducing an inert gas, which is provided to the outside of said CVD reactive chamber and is connected to said CVD reactive chamber;
   a second mass flow controller and a second valve provided to a midway of said second pipe arrangement;
   a third pipe arrangement, for discharging a gas, which is provided to the outside of said CVD reactive chamber and is connected to said CVD reactive chamber;
   a pressure gauge and a vacuum exhaust pump which are connected to said third pipe arrangement;
   a main valve provided between a pressure gauge connecting section and a pump connecting section of said third pipe arrangement;
   heater means for heating said susceptor and a semiconductor substrate via a wall of said CVD reactive chamber; and
   a valve controller for when a thin film is formed by a CVD method on said semiconductor substrate, controlling said main valve so that said main valve is closed with pressure in said CVD reactive chamber being reduced to not more than a predetermined value and thereafter when the reactive gas is introduced into said CVD reactive chamber, controlling said first valve so that said first valve is closed with the pressure in said CVD reactive chamber being set to a predetermined value.

2. A semiconductor production equipment, comprising:
   a CVD reactive chamber for inducing CVD reaction;
   a susceptor, for placing a semiconductor substrate, which is provided into said CVD reactive chamber;
   remaining region forming means, for forming a remaining region which is separated from an outside, for leaving a constant volume of a gas for film formation, to a proximity of a surface of said semiconductor substrate;
   heating means for heating said semiconductor substrate;
   transporting means for transporting said semiconductor substrate from a substrate stand-by chamber to said CVD reactive chamber;
   gas supplying means for supplying a gas to said remaining region; and
   gas exhausting means for exhausting the gas from said remaining region.

3. The semiconductor production equipment according to claim 2, wherein said gas supplying means is linked with a substrate stand-by chamber, which is freely divided from said CVD reactive chamber.

4. The semiconductor device according to claim 3, wherein said heating means is positioned in the outside of said CVD reactive chamber and heats said semiconductor substrate placed in said CVD reactive chamber.

5. The semiconductor production equipment according to claim 2, wherein said heating means heats a rear side of said semiconductor substrate.

6. A semiconductor production equipment, comprising:
   a CVD reactive chamber for inducing CVD reaction;
   a susceptor, for placing a semiconductor substrate, which is provided to the outside of said CVD reactive chamber;
   a first pipe arrangement, for introducing a reactive gas, which is provided to the outside of said CVD reactive chamber and is connected to said CVD reactive chamber;
   a first mass flow controller and a first valve provided in a midway of said first pipe arrangement;

a second pipe arrangement, for introducing an inert gas, which is provided to the outside of said CVD reactive chamber and is connected to said CVD reactive chamber;

a second mass flow controller and a second valve provided to a midway of said second pipe arrangement;

a third pipe arrangement, for exhausting a gas, which is provided to the outside of said CVD reactive chamber and is connected to said CVD reactive chamber;

a pressure gauge and a vacuum exhaust pump which are connected to said third pipe arrangement;

a main valve and a conductance valve for adjusting pressure, which are provided between a pressure gauge connecting section and a pump connecting section of said third pipe arrangement;

a valve controller for independently controlling said valves;

a substrate introducing chamber connected to said CVD reactive chamber via a gate valve;

a gate valve controller for controlling opening and closing of said gate valve;

a substrate transporter for introducing said semiconductor substrate from said substrate introducing chamber into said CVD reactive chamber;

an exhausting device for setting pressure in said substrate introducing chamber to a predetermined value;

a cover for surrounding a circumference of said semiconductor substrate in front of said suscepter and forming a constant volume of a closed space to be a remaining region for a gas;

a cover driving device which is provided so that said cover is moved in front of said suscepter between a position which surrounds the circumference of said semiconductor substrate and a forward position of the position which surrounds the circumference of said semiconductor substrate; and a heater, for heating said suscepter and said semiconductor substrate, which is provided to a rear side of said suscepter in said CVD reactive chamber.

7. The semiconductor production equipment according to claim 6, wherein;

when a thin film is formed by a CVD method on said semiconductor substrate, said gate valve controller opens said gate valve with pressure in said substrate introducing chamber and in said CVD reactive chamber being reduced to not more than predetermined values, and after said semiconductor substrate is introduced from said substrate introducing chamber into said CVD reactive chamber, closes said gate valve, and said cover driving device is provided so as to move said cover in front of said suscepter between the position which surrounds the circumference of said semiconductor substrate and the forward position of the position which surrounds the circumference of said semiconductor substrate, and when a thin film is formed by a CVD method on said semiconductor substrate, closes said cover with the reactive gas being introduced into said CVD reactive chamber and the pressure in said CVD reactive chamber being set to a predetermined value.

8. The semiconductor production equipment according to claim 6, wherein after said semiconductor substrate is introduced from said substrate introducing chamber into said CVD reactive chamber, said valve controller controls said valves so that the reactive gas is introduced into said CVD reactive chamber with said gate valve being closed so that the pressure in said CVD reactive chamber is set to a predetermined value, and after the cover is closed, the inert gas is introduced into said CVD reactive chamber so that the pressure in said CVD reactive chamber is set to a predetermined value.

9. A semiconductor production equipment, comprising:

a CVD reactive chamber for inducing CVD reaction;

a substrate stand-by chamber which is linked with said CVD reactive chamber;

a shutter which freely opens and closes a position which divides said CVD reactive chamber and said substrate stand-by chamber;

a shaft which goes through a bottom plate of said substrate stand-by chamber and freely moves up and down;

a shaft driving device for driving said shaft in an up-down direction;

a cylindrical cover which is provided to a top of a chamber of said shaft, has an opening in a front towards said CVD reactive chamber, surrounds a circumference of said semiconductor substrate with said opening being closed by said semiconductor substrate, and forms a constant volume of a closed space to be a gas remaining region;

a first pipe arrangement, for introducing a reactive gas, which is provided to the outside of said substrate stand-by chamber and is connected to said CVD reactive chamber;

a first mass flow controller and a first valve which are provided in a midway of said first pipe arrangement;

a second pipe arrangement, for introducing an inert gas, which is provided to the outside of said CVD reactive chamber and is connected to said CVD reactive chamber;

a second mass flow controller and a second valve which are provided to a midway of said second pipe arrangement;

a third pipe arrangement, for exhausting a gas, which is provided to the outside of said CVD reactive chamber and is connected to said CVD reactive chamber;

a pressure gauge and a vacuum exhaust pump which are connected to said third pipe arrangement;

a first main valve and a first conductance valve for adjusting pressure which are provided between a pressure gauge connecting section and a pump connecting section of said third pipe arrangement;

a fourth pipe arrangement, for discharging a gas, which is provided to the outside of said substrate stand-by chamber and is connected to said substrate stand-by chamber;

a pressure gauge and a vacuum exhaust pump which are connected to said fourth pipe arrangement;

a second main valve and a second conductance valve for adjusting pressure which are provided between a pressure gauge connecting section and a pump connecting section of said fourth pipe arrangement;

a valve controller for independently controlling said valves;

a substrate introducing chamber which is connected to said substrate stand-by chamber via a gate valve;

an exhausting device for reducing pressure in said substrate introducing chamber to a predetermined value;

a gate valve controller for opening and closing said gate valve;

a substrate transporting unit which has a function for introducing said semiconductor substrate from said substrate introducing chamber into said substrate stand-by chamber, a function for retaining said semiconductor substrate in said substrate stand-by chamber in a position separated from said cover, and a function for placing a surface to be processed of said semiconductor substrate towards the shaft side so as to close the opening of said cylindrical cover; and a heater for heating said semiconductor substrate through a top plate of said CVD reactive chamber.

10. The semiconductor production equipment according to claim 3, wherein said heating means heats a rear side of said semiconductor substrate.

11. The semiconductor production equipment according to claim 4, wherein said heating means heats a rear side of said semiconductor substrate.

12. The semiconductor production equipment according to claim 7, wherein after said semiconductor substrate is introduced from said substrate introducing chamber into said CVD reactive chamber, said valve controller controls said valves so that the reactive gas is introduced into said CVD reactive chamber with said gate valve being closed so that the pressure in said CVD reactive chamber is set to a predetermined value, and after the cover is closed, the inert gas is introduced into said CVD reactive chamber so that the pressure in said CVD reactive chamber is set to a predetermined value.

* * * * *